United States Patent
Matarrese et al.

(10) Patent No.: US 6,563,732 B2
(45) Date of Patent: May 13, 2003

(54) REDUNDANCY CIRCUIT AND METHOD FOR FLASH MEMORY DEVICES

(75) Inventors: Stella Matarrese, Fremont, CA (US); Luca Giovanni Fasoli, Fremont, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/922,068

(22) Filed: Aug. 2, 2001

(65) Prior Publication Data

US 2003/0026129 A1 Feb. 6, 2003

(51) Int. Cl.[7] .................................................. G11C 7/00
(52) U.S. Cl. ............. 365/185.09; 365/200; 365/185.33; 365/230.01; 365/230.06
(58) Field of Search ....................... 365/189.01, 230.01, 365/230.03, 230.06, 200, 185.01, 185.33, 185.09

(56) References Cited

U.S. PATENT DOCUMENTS

| 5,592,417 | A | | 1/1997 | Mirabel ................. 365/185.07 |
| 5,822,256 | A | | 10/1998 | Bauer et al. ................. 365/200 |
| 5,966,336 | A | | 10/1999 | Horiguchi et al. .......... 365/200 |
| 6,307,795 | B1 | * | 10/2001 | Blodgett ..................... 365/200 |
| 6,320,800 | B1 | * | 11/2001 | Saito et al. ................. 365/200 |
| 2001/0028584 | A1 | * | 10/2001 | Nakayama et al. ......... 365/203 |
| 2002/0012282 | A1 | * | 1/2002 | Saito et al. ................. 365/200 |
| 2002/0060934 | A1 | * | 5/2002 | Choi et al. ................. 365/200 |

FOREIGN PATENT DOCUMENTS

| DE | 198 25 012 A1 | 8/1999 |
| EP | 0 745 995 A1 | 12/1996 |
| WO | WO 96/31882 | 10/1996 |

OTHER PUBLICATIONS

EPO; European Search Report for EP 02255371.3; Nov. 18, 2002.
U.S. patent application Ser. No. 09/922,176, Matarrese et al., filed Aug. 2, 2002.

* cited by examiner

*Primary Examiner*—Viet Q. Nguyen
(74) *Attorney, Agent, or Firm*—Lisa K. Jorgenson; Andre Szuwalski

(57) ABSTRACT

A method and circuit are disclosed for replacing defective columns of flash memory cells in flash memory device. The circuit includes a plurality of sets of storage elements, each set of storage elements being capable of identifying at least one column of memory cells in any block of memory cells as being defective. The circuit further includes control circuitry for replacing an addressed column of memory cells with a redundant column of memory cells upon an affirmative determination that a set of storage elements identifies the addressed column of memory cells as being defective.

30 Claims, 3 Drawing Sheets

REDUNDANCY CIRCUIT AND METHOD FOR FLASH MEMORY DEVICES

BACKGROUND OF THE INVENTION

1. Technical Field of the Invention

The present invention relates to nonvolatile memory devices, and particularly to nonvolatile memory devices having column redundancy.

2. Description of the Related Art

The first nonvolatile memories were electrically programmable read-only memories (EPROMs). In these memories, the memory cells include a floating-gate transistor that is programmable using the hot carrier effect. Programming of an EPROM memory cell includes applying a potential difference between the drain and the source of the floating gate transistor in the presence of a high potential difference (of about 20 volts, this value varying according to the desired programming speed) between the control gate and the source. The application of the first of these potential differences generates an electrical field that gives rise to a flow of electrons in the channel. These electrons collide with atoms of the channel, causing the appearance of new free electrons. These electrons have very high energy (hence the term "hot carriers"). The high difference in potential between the control gate and the source of the floating gate transistor gives rise to a strong electrical field between the floating gate and the substrate, the effect of which is that certain of these electrons are injected into the floating gate, thus putting the memory cell in a state known as a "programmed" state.

The fact that the programming of a memory cell requires the application of voltages both to the control gate and to the drain of the floating-gate transistor eliminates the need for the use of a selection transistor to program one particular memory cell without programming the others. This results in a relatively small silicon area and the effectuation of large scale integration. By contrast, the erasure of all the memory cells of the memory is done substantially simultaneously by exposing the memory cells to ultraviolet radiation.

In addressing the need to individually erase EPROM memory cells, electrically erasable programmable read only memories (EEPROMs) were created. These memories are electrically programmable and erasable by tunnel effect (i.e., the Fowler Nordheim effect). The memory cells have a floating-gate transistor whose drain is connected to the bit line by a selection transistor. The gate of the selection transistor is connected to the word line. The gate of the floating-gate transistor is controlled by a bias transistor. Generally, the source of the floating gate transistor is connected to a reference potential, such as ground. These floating-gate transistors have an oxide layer between the substrate and the floating gate that is very thin to enable the transfer of charges by tunnel effect. The advantage of EEPROMs as compared with EPROMs lies in the fact that each memory cell is programmable and erasable independently of the other EEPROM cells. The tradeoff here is that a larger surface area of silicon is required and therefore a smaller scale of integration is achieved.

A third type of memory has more recently gained popularity. This type of memory, flash EPROMs, combines the relatively high integration of EPROMs with the ease of programming and erasure of EEPROMs. Flash memory cells can be individually programmed utilizing the hot carrier effect in the same way as EPROM cells are programmed. Flash memory cells are also electrically erasable by the tunnel effect. The memory cells of a flash EPROM memory includes a floating-gate transistor that has an oxide layer whose thickness is greater than the oxide layer thickness of an EEPROM floating gate transistor but smaller than the oxide layer thickness of an EPROM floating gate transistor. Consequently, the flash memory cell is capable of erasure by the tunnel effect. For erasure, a highly negative potential difference is created between the control gate and the source of the floating gate transistor, the drain being left in the high impedance state or connected to the ground potential so that a high electrical field is created which tends to remove the electrons from the floating gate.

Referring to FIG. 1, flash EPROM devices, hereinafter. referred to as flash memory devices, typically include at least one array A of flash memory cells organized into rows and columns of flash memory cells. Array A is typically partitioned into blocks B, each of which is further divided into sectors S. A row decoder R and column decoder C are used to select a single row and at least one column of memory cells based upon the value of an externally generated address applied to the flash memory device. Sense amplifiers SA are coupled to the column lines corresponding to the columns of memory cells to amplify the voltage levels on the addressed column lines corresponding to the data values stored in the addressed flash memory cells. The particular implementations of array A, the row and column decoders and sense amplifiers SA are known in the art and will not be described further for reasons of simplicity.

Redundancy has been previously utilized in flash memory devices to, among other things, replace columns of memory cells having a defect with redundant columns of memory cells so as to improve manufacturing yield. In one existing flash memory design, redundant columns RC are disposed in or immediately adjacent each block B. Each block B corresponds to a distinct set of redundant columns RC, as shown in FIG. 1. A redundant column RC is adapted to replace a column of flash memory cells having a defect (i.e., a defective column) in the block B with which redundant column RC is associated. Nonvolatile storage components SC, which may be maintained in a secondary array of memory cells, are utilized to identify whether the redundant columns RC are used to replace a defective column. In particular, a single storage component SC is associated with a distinct redundant column RC. Each storage component SC is capable of storing the column address of the defective column that the associated redundant column replaces, together with an enable bit to enable the column replacement during a memory access operation. Sense amplifiers SAR are coupled to the column lines of redundant columns RC to perform sense amplification during memory access operations. In this way, the existing flash memory device of FIG. 1 is capable of replacing defective columns in the flash memory array A with redundant columns of redundant memory cells and thereby improve manufacturing yield.

However, the ability of the existing flash memory device of FIG. 1 to replace defective columns of memory cells is limited as the number of defective columns increases. This reduced inability is due in part to the fact that the maximum number of redundant columns that can be used in a single word is equal to the number of sense amplifiers SAR used for sense amplification of the redundant columns RC. The reduced inability is also due to the fact that the maximum number of defective columns that can be replaced in any block B is equal to the number of redundant columns RC in a block B. As a result of this reduced inability to replace defective columns of flash memory cells as the number of defective columns increases, there is a need to more efficiently replace defective columns in flash memory devices.

SUMMARY OF THE INVENTION

Embodiments of the present invention overcome shortcomings in prior flash memory devices and satisfy a significant need for a flash memory device having improved repair probability for the redundant circuitry provided. According to an exemplary embodiment of the present invention, a flash memory device includes sets of secondary storage elements, each of which is not rigidly associated with a single redundant column in a block of memory cells. Instead, each set of secondary storage elements is capable of identifying a column in any block of memory cells as having a defect. In this way, the number of sets of secondary storage elements is not fixed to the number of redundant columns and is instead based upon the maximum number of defective columns of memory cells that is desired to be replaced. Consequently, the repair probability is enhanced without substantially increasing the number of secondary storage elements.

An exemplary flash memory device includes at least one array of memory cells arranged into rows and columns and partitioned into a plurality of blocks of memory cells, such that each block of memory cells includes a plurality of redundant columns of memory cells. Address decode circuitry receives an externally-generated address and selects a row and at least one column of memory cells corresponding to the externally-generated address. The exemplary flash memory device further includes a secondary memory array having the plurality of sets of secondary storage elements located therein. Redundancy circuitry examines each set of secondary storage elements, and replaces a selected column of memory cells with a redundant column of memory cells upon an affirmative determination that a set of secondary storage elements in the secondary memory array identifies the selected column of memory cells as being defective.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS OF THE PRESENT INVENTION

The present invention will now be described more fully hereinafter with reference to the accompanying drawings in which an exemplary embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 2:
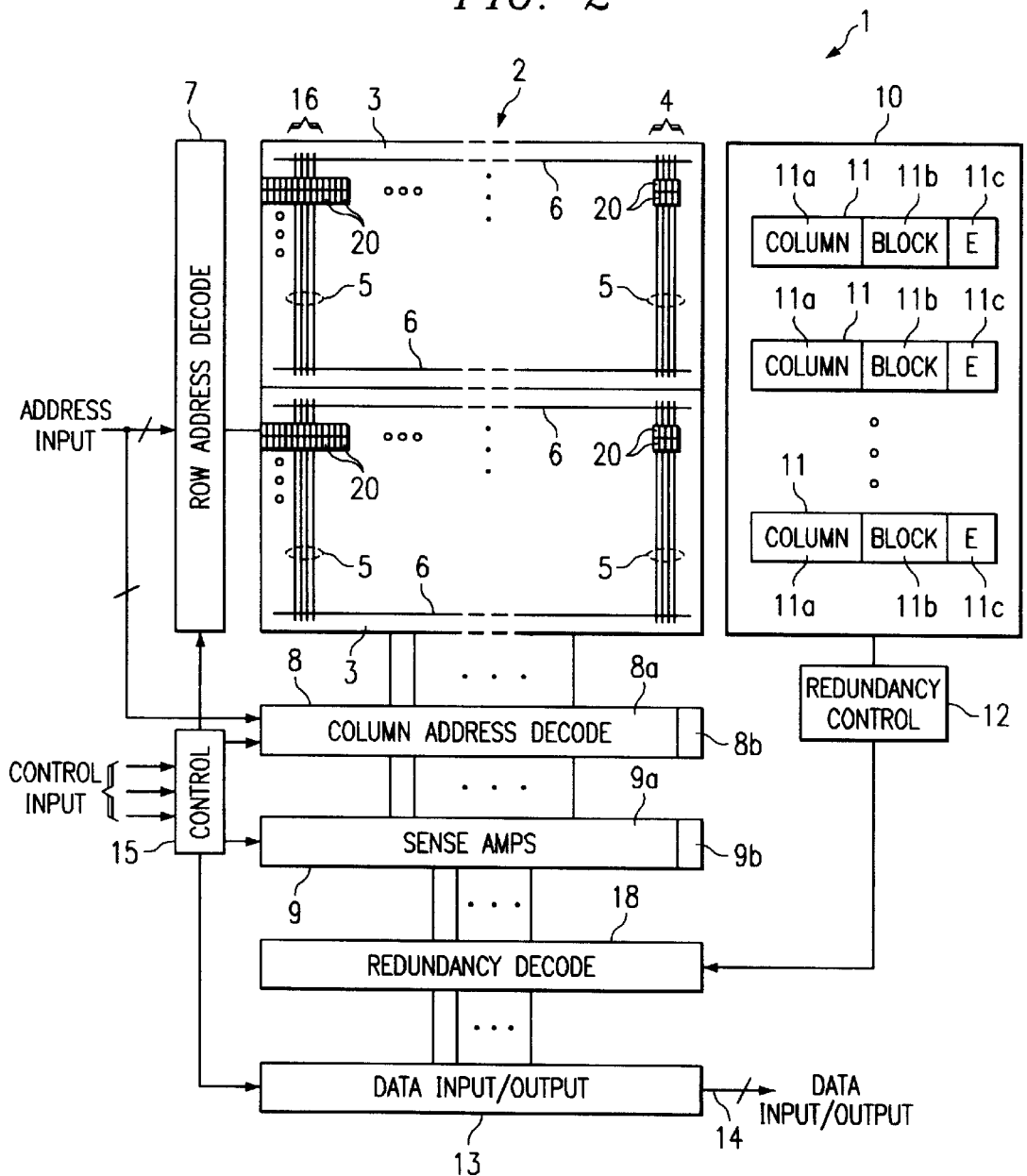
FIG. 2 is a block diagram of a flash memory device according to an exemplary embodiment of the present invention.

Referring to FIG. 2, there is shown a nonvolatile memory device 1 according to an exemplary embodiment of the present invention. Although it is understood that the nonvolatile memory device 1 may be virtually any type of nonvolatile memory device, nonvolatile memory device 1 will be described below as a flash memory device for reasons of simplicity.

In general terms, flash memory device 1 includes redundant circuitry for efficiently replacing columns of memory cells 20 having a defect. Flash memory device 1 includes at least one array 2 of memory cells 20. Array 2 of memory cells 20 may be arranged into rows and columns 16 of memory cells 20. According to the exemplary embodiment of the present invention, array 2 is partitioned into blocks 3 of memory cells 20, with each block 3 being further partitioned into one or more sectors of memory cells 20. Each block 3 of memory cells 20 may include a plurality of redundant columns 4 of redundant memory cells 20. Each redundant column 4 of redundant memory cells 20 is capable of replacing any of a plurality of regular. (i.e., non-redundant) columns 16 of memory cells 20 in the block 3 in which the redundant column 4 is disposed, as discussed in greater detail below. Although array 2 is illustrated in FIG. 2 as being divided into two blocks 3 of memory cells 20, it is understood that array 2 may be divided into more than two blocks 3 of memory cells 20.

Array 2 is shown in FIG. 2 as being relatively sparsely populated with memory cells 20 for reasons of clarity. It is understood that array 2 is substantially entirely populated with memory cells 20, arranged in rows and columns of memory cells 20 as described above.

The redundant columns 4 of each block 3 of memory cells 20 are adapted to replace defective columns 16 of memory cells 20 in the block 3 according to a predetermined replacement scheme. For instance, both the regular columns 16 and the redundant columns 4 in a block 3 may be each divided into one or more sets, with each set of redundant columns 4 being capable of replacing columns 16 in a distinct set of regular columns. The particular redundant column 4 of a set of redundant columns that selectively replaces a defective column of a set of columns 16 in the block 3 may be based upon the column address of the defective column 16. In particular, a portion of the column address of the defective column is used to identify the particular redundant column 4 in the corresponding set of redundant columns 4. In this way, for a given defective column, the redundant column 4 that may selectively replace the defective column may be substantially quickly and simply determined.

The memory cells 20 in each column of memory cells 20 in a block 3 may be connected to a distinct column line 5, and the memory cells 20 in each row of memory cells 20 in a block 3 may be connected to a distinct row line 6. Column lines 5 may be local column lines that are coupled to main column lines (not shown in FIG. 2) for providing the selected local column lines to the periphery of array 2. The use of local and main column lines in flash memories are known in the art and will not be described in greater detail for reasons of simplicity.

Flash memory device 1 may further include row decode circuitry 7 which receives an externally generated address or portion thereof and selects and/or activates a row of memory cells 20 in a block 3. In particular, the row of memory cells 20 corresponding to the externally generated address is selected and/or activated by being connected to column lines 5. Row decode circuitry 7 may include logic that, for example, in response to receiving an externally generated address, drives a single row line 6 corresponding to the externally generating address to a first voltage level to activate each memory cell in the row, while driving the remaining row lines 6 to another voltage level to deactivate the memory cells 20 in the remaining rows. Row decode circuitry 7 may be implemented with boolean logic gates as is known in the art.

Further, flash memory device 1 may include column decode circuitry 8 which receives an externally generated address and selects one or more column lines 5 corresponding to the externally generated address. Column decode circuitry 8 may, for example, be implemented as multiplexing circuitry connected to each column line 5 in array 2. Column decode circuitry 8 may include decode circuitry 8a for selecting one or more column lines 5 associated with regular columns 16 of memory cells 20 and redundant decode circuitry 8b for selecting one or more column lines 5 associated with redundant columns 4 of redundant memory cells 20.

During a memory read operation, addressed memory cells 20 are connected to the column lines 5 corresponding thereto. Typically, the connection of the addressed memory cells 20 to their corresponding column lines 5 results in the column lines 5 being at one of two or more voltage levels. Flash memory device 1 may include sense amplifiers 9 that sense the voltage levels on the column lines 5 corresponding to the data stored in the addressed memory cells 20 and drive sense amplifier output signals to voltage levels that are more easily interpreted or otherwise handled by circuitry external to array 2. Sense amplifiers 9 may include sense amplifiers 9a coupled to column lines 5 of regular columns 16, and sense amplifiers 9b coupled to column lines 5 of redundant columns 4.

It is further understood, that sense amplifiers 9 may be connected between column lines 5 and column decode circuitry 8. In this embodiment, sense amplifiers 9 are connected to column lines 5 of each block 3 of memory cells 20.

Flash memory device 1 may include a data input/output (I/O) circuit 13 that generally couples addressed memory cells 20 to external I/O data pins 14 of flash memory device 1. As shown in FIG. 2, data I/O circuit 13 is connected to sense amplifiers 9. Flash memory device 1 may also include control circuitry 15 for receiving externally generated, input control signals and controlling the various components of flash memory device 1 (row decode circuitry 7, column decode circuitry 8, sense amplifiers 9, data I/O circuit 13, etc.) to perform memory access operations.

Flash memory device 1 may include a secondary array 10 of memory cells that may be adjacent to array 2. Secondary array 10 may include flash memory cells or other non-volatile memory cells/data storage circuits. The memory cells of secondary array 10 may be organized into groups 11 of memory cells. According to the exemplary embodiment of the present invention, each group 11 of memory cells in secondary array 10 is capable of identifying any defective column 16 of memory cells 20 in any block 3. In other words, each group 11 of memory cells in secondary array 10 is not rigidly associated with only one redundant column 4 of redundant memory cells 20, for use in replacing a defective column 16. There is no one-to-one correspondence between a group 11 of memory cells in secondary array 10 and a redundant column 4 of redundant memory cells 20. In order to be able to identify any column 16 in any block 3 of memory cells 20 as having a defect, each group 11 of memory cells in secondary array 10 includes a sufficient number of memory cells to store a column address of the defective column 16 as well as the block address in which the defective column 16 is located. Each group 11 includes a first sub-group 11a of memory cells capable of storing the column address of a defective column 16, and a second sub-group 11b of memory cells capable of storing the block address in which the defective column 16 is located. A third sub-group 11c of memory cells indicates whether the group 11 stores information relating to a defective column 16 in the array 2 of memory cells 20. The third sub-group 11c may be used to enable the replacement of a defective column 16 of memory cells 20 with a redundant column 4 of redundant memory cells 20 during a memory access operation.

Flash memory device 1 may further include redundancy decode circuitry 18 coupled to receive the output of each sense amplifier 9 and selectively replace the output of one or more sense amplifiers 9a associated with a defective column 16 with the output of one or more sense amplifiers 9b associated with a redundant column 4. Redundancy decode circuitry 18 may be implemented, for example, with multiplexing circuitry to effectively replace the output of one or more sense amplifiers 9a with the output of one or more sense amplifiers 9b. Redundancy decode circuitry 18 replaces the output of a sense amplifier 9 with the output of a sense amplifier 9b based upon the contents of secondary array 10.

Redundancy decode circuitry 18 is implemented to replace the output of a sense amplifier 9a with the output of a sense amplifier 9b, in order to minimize the timing of a memory read operation and/or maintain the timing of a memory read operation within acceptable limits. It is understood, however, that redundancy decode circuitry 18 may be implemented between column decode circuit 8 and sense amplifiers 9 and/or otherwise made part of column decode circuit 8. In this implementation, redundancy decode circuitry 18 selectively replaces a column line 5 associated with a defective column 16 with a column line 5 associated with a redundant column 4 of memory cells. The output of redundancy decode circuitry 18 would, in this case, be connected to the input of sense amplifiers 9. In either implementation, the net effect is that a defective column 16 of memory cells is replaced with a redundant column 4 of memory cells.

Flash memory device 1 may further include a redundancy control circuit 12 for, in general terms, selectively replacing a defective column 16 of memory cells 20 in any block 3 with a redundant column 4 within the same block 3 during a memory access operation. In particular, redundancy control circuit 12 and redundancy decode circuitry 18 selectively replace the output of a sense amplifier 9a associated with a defective column 16 of memory cells with the output of a sense amplifier 9b associated with a redundant column 4 of memory cells. Redundancy control circuit 12 reads each group 11 of memory cells in secondary array 10 during a memory access operation to see if an addressed column is identified by a group 11 as being defective. Redundancy control circuit 12 compares the block address and the column address corresponding the externally generated address with the block address and column address, respectively, stored in each group 11 in secondary array 10. Upon an affirmative determination that a group 11 in secondary array 10 identifies an addressed column 16 as being defective (i.e., the externally generated address matches the address values stored in a group 11), redundancy control circuit 12 controls redundancy decode circuitry 18 to cause the replacement of the output of the sense amplifier 9a associated with the addressed, defective column 16 with the output of a sense amplifier 9b associated with a redundant column 4 located in the same block 3. In this way, redundancy control circuit 12 and secondary array 11 may combine to form a content addressable memory (CAM) or otherwise perform CAM-type operations.

Figure 3:
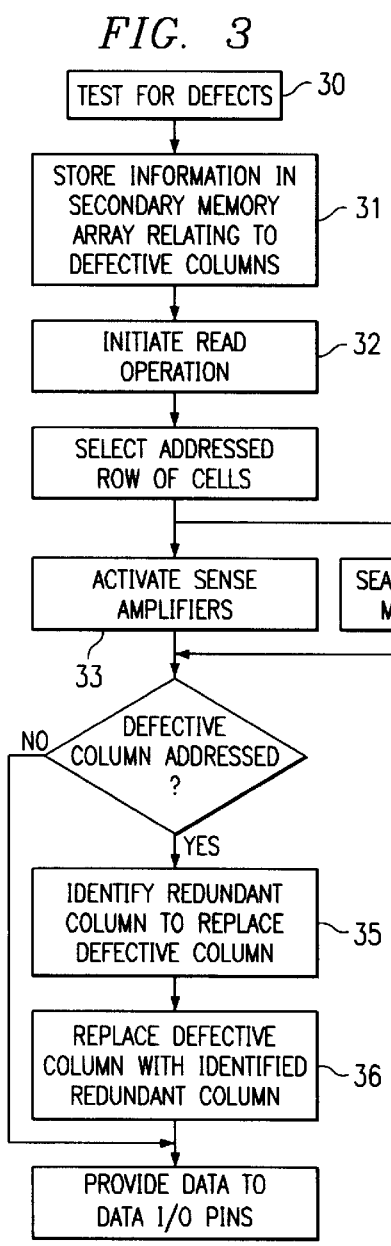
FIG. 3 is a flow chart illustrating an operation of the exemplary flash memory device of FIG. 2.

The operation of flash memory device 1 in performing a memory read operation will be described with reference to FIG. 3. Initially, flash memory device 1 is tested for defects at step 30. In the event that a column of memory cells is found to be defective, the column address and block address relating to the defective column 16 are stored in groups 11a and 11b, respectively, in any one group 11 of memory cells in secondary array 10 at 31. At this time, group 11c of the group is programmed to indicate that the group 11 now identifies the defective column 16. It is understood that steps 30 and 31 may be performed, for example, by the manufacturer before delivery of the flash memory device 1 to a user.

A memory read operation is subsequently initiated at 32 by applying to flash memory device 1 an externally-generated address and input control signals to initiate a memory read operation. Upon reception of these signals, row decode circuitry 7 selects a row of memory cells 20 in memory cell array 2, and column decode circuitry 8 selects one or more column lines 5 for connection to sense amplifiers 9. Sense amplifiers 9 are then activated at 33 to sense the voltage levels appearing on column lines 5 connected thereto and drive the sense amplifier outputs to the appropriate voltage levels, based upon the voltage level of the column lines 5 prior to sensing by the sense amplifiers 9.

At around this same time, redundancy control circuit 12 examines at 34 the contents of secondary array 10 to see if secondary array 10 identifies any of the addressed columns 16 as being defective. If any group 11 of memory cells in secondary array 2 has stored therein the block address and column address corresponding to an addressed column 16, then redundancy control circuit 12 determines at 35 the particular redundant column 4 that is to replace the addressed, defective column 16 identified by the group 11. This determination may, for example, be based in part upon the column address corresponding to the defective column 16. Once the particular redundant column(s) 4 is identified, redundancy control circuit 12 controls at 36 redundancy decode circuitry 18 so that the output of sense amplifiers 9a associated with addressed columns 16 that are defect-free are connected to data I/O circuit 13, together with the output of sense amplifiers 9b associated with the particular redundant column(s) 4 identified during step 35. In other words, control circuit 10 controls redundancy decode circuitry 18 so that the particular redundant column(s) 4 identified by secondary array 2 replaces the corresponding defective column(s) 16 at 35. Thereafter, the outputs of redundancy decode circuitry 18 are available to data I/O circuit 13 for driving the external data I/O pins 14 accordingly, thereby completing the memory read operation.

As discussed above, a shortcoming of prior redundancy schemes for flash memories results in a relatively low repair probability and/or redundancy efficiency. Because there is no one-to-one correspondence between groups 11 of memory cells in secondary array 10 and redundant columns 4, and because each group 11 may identify any defective column 16 in any of a plurality of blocks 3, less groups 11 of memory cells are needed to repair the same number of defective columns, relative to prior flash memory devices.

Figure 1:
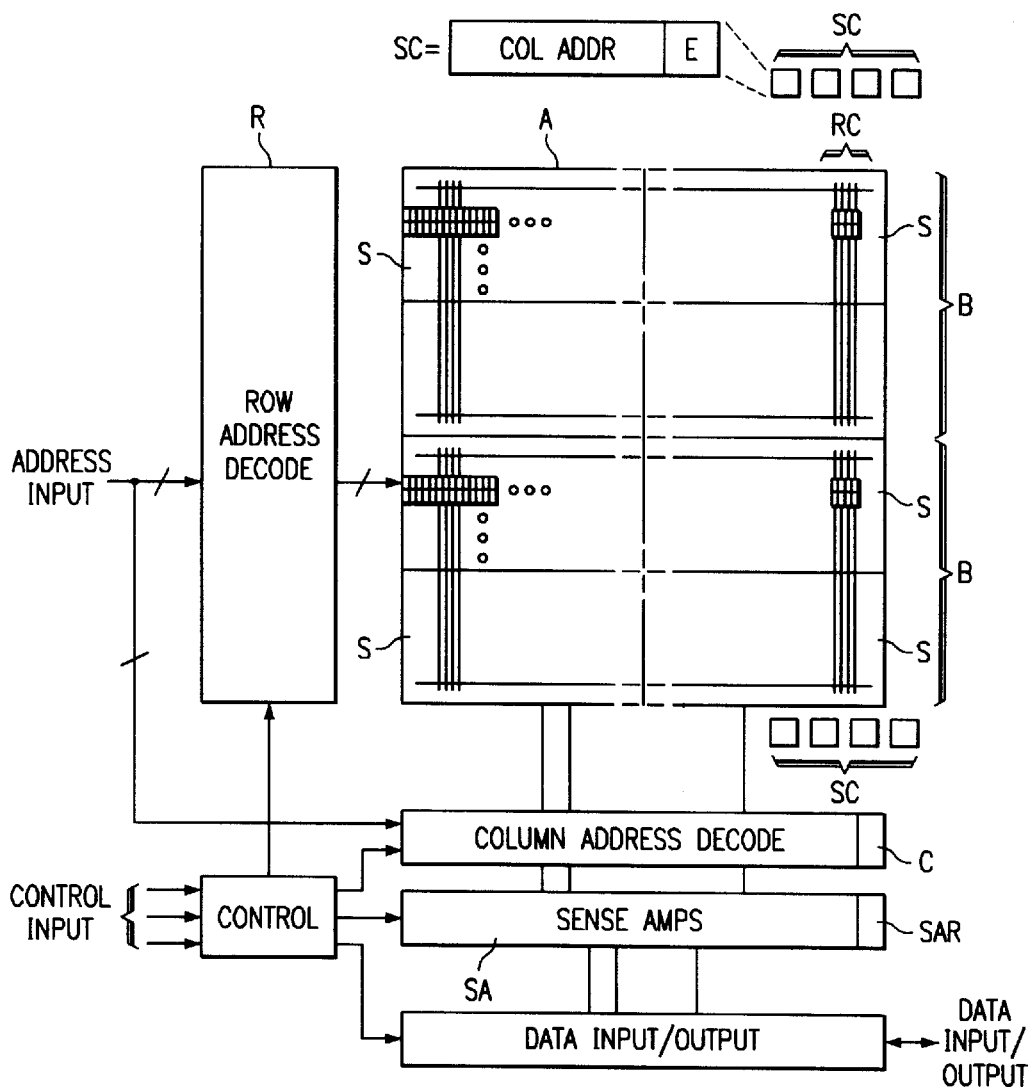
FIG. 1 is a block diagram of a known flash memory device.
Figure 4:
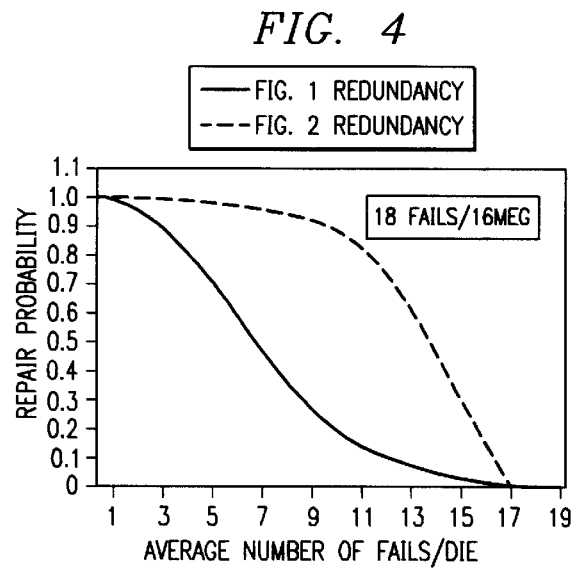
FIG. 4 is graph illustrating of the repair probability of the flash memory device of FIG. 2, relative to the repair probability of the flash memory device of FIG. 1, for a substantially equal number of secondary storage elements.

FIG. 4 is a plot of the repair probability for the above-discussed prior redundancy scheme of FIG. 1 and the redundancy scheme of flash memory device 1 of FIG. 2 according to the exemplary embodiment of the present invention. As can be seen, for substantially the same number of storage elements in secondary array 2, the repair probability for the redundancy scheme of the present invention is substantially increased.

Further, because the number of groups 11 of memory cells in secondary array 10 is not tied to the number of redundant columns 4, the flash memory device 1 may increase the repair probability without increasing the number of groups 11 in secondary array 10. For instance, if the size of blocks 3 are halved (i.e., the number of blocks 3 in array 2 are doubled), the repair probability increases. The only real effect the halving of blocks 3 has on secondary array 2 is that each group 11 in secondary array 2 must now include an additional bit for identifying the addressed block 3. As a result, the repair probability of flash memory device 1 is increased without a substantial increase in the size of secondary array 10.

Figure 5:
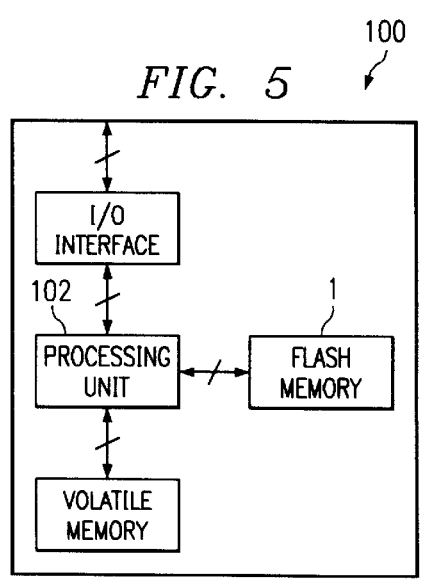
FIG. 5 is a block diagram of a computing/communications device having therein the flash memory device of FIG. 2.

It is understood that flash memory device 1 may be utilized in any of a number of devices requiring nonvolatile memory. For instance, flash memory device 1 may be located in an electronics system 100 (FIG. 5) having a processing unit 102 that accesses data stored in flash memory device 1. System 100 may be, for example, a computer and/or data processing device, or a telecommunications device, such as a wireless telephone.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile memory device, comprising:
at least one array of memory cells arranged into rows and columns and partitioned into a plurality of blocks of memory cells, each block including a plurality of redundant columns of memory cells;
address decode circuitry for receiving an externally-generated address and selecting a row and at least one column of memory cells corresponding thereto;
a plurality of sets of storage elements, at least one set of storage elements being capable of identifying any column of memory cells in at least one block of memory cells as being defective; and
redundancy circuitry for replacing at least one selected column of memory cells with at least one redundant column of memory cells upon an affirmative determination that a set of storage elements identifies the at least one selected column of memory cells as being defective;
the at least one array includes a plurality of column lines, each column of memory cells being coupled to a distinct column line;
the nonvolatile memory device further comprises a plurality of sense amplifiers coupled to the column lines; and
the redundancy circuitry comprises:
redundancy decode circuitry coupled to outputs of the sense amplifiers; and
redundancy control circuitry for controlling the redundancy decode circuitry to couple to external data pins of the nonvolatile memory device at least one output of a sense amplifier associated with the at least one redundant column and to decouple from the external data pins at least one output of the sense amplifier associated with the at least one selected column, based upon the affirmative determination that a set of storage elements identifies the at least one selected column of memory cells as having a defect.

2. The nonvolatile memory device of claim 1, wherein:

each set of storage elements is capable of identifying any column of memory cells in any block of memory cells as being defective.

3. The nonvolatile memory device of claim 1, wherein:

the at least one set of storage elements is capable of maintaining a column address and a block address corresponding to a defective column of memory cells in the at least one array of memory cells.

4. A nonvolatile memory device, comprising:

at least one array of memory cells arranged into rows and columns and partitioned into a plurality of blocks of memory cells, each block including a plurality of redundant columns of memory cells;

address decode circuitry for receiving an externally-generated address and selecting a row and at least one column of memory cells corresponding thereto;

a plurality of sets of storage elements, at least one set of storage elements being capable of identifying any column of memory cells in at least one block of memory cells as being defective; and redundancy circuitry for replacing at least one selected column of memory cells with at least one redundant column of memory cells upon an affirmative determination that a set of storage elements identifies the at least one selected column of memory cells as being defective;

the at least one set of storage elements is capable of maintaining a column address, a block address corresponding to a defective column of memory cells in the at least one array of memory cells, and an enable bit identifying whether the at least one set of storage element maintains column and block addresses corresponding to a defective column of memory cells in the at least one array of memory cells.

5. The nonvolatile memory device of claim 3, wherein:

the storage elements in the sets of storage elements comprise flash memory cells.

6. The nonvolatile memory device of claim 3, wherein:

the storage elements in the sets of storage elements comprise flash memory cells in a secondary array adjacent the at least one array of memory cells.

7. A nonvolatile memory device, comprising:

at least one array of memory cells arranged into rows and columns and partitioned into a plurality of blocks of memory cells, each block including a plurality of redundant columns of memory cells;

address decode circuitry for receiving an externally-generated address and selecting a row and at least one column of memory cells corresponding thereto, a plurality of sets of storage elements, at least one set of storage elements being capable of identifying any column of memory cells in at least one block of memory cells as being defective; and redundancy circuitry for replacing at least one selected column of memory cells with at least one redundant column of memory cells upon an affirmative determination that a set of storage elements identifies the at least one selected column of memory cells as being defective;

the redundancy circuitry and the sets of storage elements form a content addressable memory.

8. The nonvolatile memory device of claim 1, wherein:

the number of sets of storage elements is less than the number of redundant columns in the at least one array of memory cells.

9. The nonvolatile memory device of claim 1, wherein:

the nonvolatile memory device is disposed in an electronics device having a processing unit therein.

10. A method of performing a memory read operation on a nonvolatile memory device having at least one array of memory cells arranged into rows and columns, and a secondary array of memory cells, comprising:

receiving an address corresponding to a row and at least one column of memory cells;

selecting the row of memory cells and the at least one column of memory cells corresponding to the received address;

searching the secondary array of memory cells and determining whether any group of memory cells in the secondary array of memory cells identifies the selected at least one column of memory cells as having a defect; and upon an affirmative determination that a group of memory cells in the secondary array of memory cells identifies the selected at least one column of memory cells as having a defect, replacing the selected at least one column with a redundant column of redundant memory cells, the redundant column of redundant memory cells providing a data value to data pins of the nonvolatile memory device during the memory read operation;

the nonvolatile memory device comprises a plurality of sense amplifiers; and the step of replacing comprises decoupling from the data pins an output of the sense amplifier associated with the selected at least one column having the defect, and coupling to the data pins an output of the sense amplifier associated with the redundant column of redundant memory cells.

11. The method of claim 10, further comprising:

initially determining whether a column in the at least one array of memory cells contains a defect, and storing in any one group of memory cells in the secondary array of memory cells the block address and column address corresponding to the column having the defect.

12. A nonvolatile memory device, comprising:

at least one array of memory cells arranged into rows and columns and partitioned into a plurality of blocks of memory cells, each block including a plurality of redundant columns of memory cells;

address decode circuitry for receiving an externally-generated address and selecting a row and at least one column of memory cells corresponding thereto;

a plurality of sets of storage elements, the sets of storage elements being capable of identifying at least one column of memory cells in any block of memory cells as being defective;

redundancy circuitry for replacing at least one selected column of memory cells with at least one redundant column of memory cells upon an affirmative determination that a set of storage elements identifies the at least one selected column of memory cells as being defective; and a plurality of sense amplifiers coupled to the redundant columns;

wherein the redundancy circuitry selectively disconnects from data pins of the nonvolatile memory device the output of a sense amplifier associated with the at least one selected column of memory cells identified as being defective, and selectively connects the data pins to the sense amplifier coupled to the at least one redundant column during a memory read operation.

13. The nonvolatile memory device of claim 12, wherein:
the sets of storage elements are capable of identifying any column of memory cells in any block of memory cells as being defective.

14. The nonvolatile memory device of claim 12, wherein:
the sets of storage elements are capable of maintaining a column address and a block address corresponding to a defective column of memory cells in the at least one array of memory cells.

15. A nonvolatile memory device, comprising:
at least one array of memory cells arranged into rows and columns and partitioned into a plurality of blocks of memory cells, each block including a plurality of redundant columns of memory cells;
address decode circuitry for receiving an externally-generated address and selecting a row and at least one column of memory cells corresponding thereto;
a plurality of sets of storage elements, the sets of storage elements being capable of identifying at least one column of memory cells in any block of memory cells as being defective; and
redundancy circuitry for replacing at least one selected column of memory cells with at least one redundant column of memory cells upon an affirmative determination that a set of storage elements identifies the at least one selected column of memory cells as being defective;
the sets of storage elements are capable of maintaining a column address and a block address corresponding to a defective column of memory cells in the at least one array of memory cells;
each set of storage elements is capable of further maintaining an enable bit identifying whether the set of storage elements maintains column and block addresses corresponding to a defective column of memory cells in the at least one array of memory cells.

16. The nonvolatile memory device of claim 12, wherein:
the storage elements in the sets of storage elements comprise flash memory cells.

17. The nonvolatile memory device of claim 12, wherein:
the storage elements in the sets of storage elements comprise flash memory cells in a secondary array adjacent the at least one array of memory cells.

18. A nonvolatile memory device, comprising:
at least one array of memory cells arranged into rows and columns and partitioned into a plurality of blocks of memory cells, each block including a plurality of redundant columns of memory cells;
address decode circuitry for receiving an externally-generated address and selecting a row and at least one column of memory cells corresponding thereto;
a plurality of sets of storage elements, the sets of storage elements being capable of identifying at least one column of memory cells in any block of memory cells as being defective; and
redundancy circuitry for replacing at least one selected column of memory cells with at least one redundant column of memory cells upon an affirmative determination that a set of storage elements identifies the at least one selected column of memory cells as being defective;
the redundancy circuitry and the sets of storage elements form a content addressable memory.

19. The nonvolatile memory device of claim 12, wherein:
the number of sets of storage elements is less than the number of redundant columns in the at least one array of memory cells.

20. The nonvolatile memory device of claim 12, wherein:
The nonvolatile memory device is disposed in an electronics device having a processing element.

21. A flash memory device, comprising:
at least one array of memory cells arranged into rows and columns and partitioned into a plurality of blocks of memory cells, each block including a plurality of redundant columns of memory cells;
decode means for receiving an externally-generated address and selecting a row and a column of memory cells corresponding thereto;
a plurality of sense amplifiers coupled to the redundant columns;
storage means for identifying any column of memory cells in at least one block of memory cells as being defective; and
redundancy means for replacing a selected column of memory cells with a redundant column of memory cells upon an affirmative determination that the storage means identifies the selected column of memory cells as being defective, said replacing comprises selectively disconnecting from data pins of the flash memory device at least one output of a sense amplifier associated with the selected column of memory cells identified as being defective, and selectively connecting to the data pins the sense amplifier coupled to the redundant column during a memory read operation.

22. An electronics device, comprising:
a processing unit; and
a flash memory device coupled to the processing unit, comprising:
at least one array of memory cells arranged into rows and columns and partitioned into a plurality of blocks of memory cells, each block including a plurality of redundant columns of memory cells;
address decode circuitry for receiving an externally-generated address and selecting a row and at least one column of memory cells corresponding thereto;
a plurality of sets of storage elements, the sets of storage elements being capable of identifying at least one column of memory cells in at least one block of memory cells as being defective; and
redundancy circuitry for replacing a selected column of memory cells with a redundant column of memory cells upon an affirmative determination that a set of storage elements identifies the selected column of memory cells as being defective, the plurality of sets of storage elements and at least a portion of the redundancy circuitry performing as a content addressable memory.

23. The nonvolatile memory device of claim 4, wherein each of the memory cells and the storage elements in the sets of storage elements comprise flash memory cell transistors.

24. The nonvolatile memory device of claim 7, wherein the storage elements in the sets of storage elements comprise flash memory cells adjacent the at least one array of memory cells.

25. The nonvolatile memory device of claim 7, wherein each set of storage elements is capable of identifying any column of memory cells in any block of memory cells as being defective.

26. The nonvolatile memory device of claim 15, wherein the memory cells and the storage elements comprise flash memory cells.

27. The nonvolatile memory device of claim 15, wherein each set of storage elements is capable of identifying any column of memory cells in any block as being defective.

28. The nonvolatile memory device of claim 21, wherein the storage means and at least a portion of the redundancy means form a content addressable memory.

29. The nonvolatile memory device of claim 21, wherein the storage means stores block address, column address and enabling information of the selected column of memory cells.

30. The electronics device of claim 22, wherein:

the flash memory device further comprises column lines coupled to the columns of memory cells, and a plurality of sense amplifiers coupled to the column lines; and the redundancy circuitry comprises:
   redundancy decode circuitry coupled to outputs of the sense amplifiers; and redundancy control circuitry for controlling the redundancy decode circuitry to couple to external data pins of the flash memory device at least one output of a sense amplifier associated with the at least one redundant column and to decouple from the external data pins an output of the sense amplifier associated with the at least one selected column, based upon the affirmative determination that a set of storage elements identifies the at least one selected column of memory cells as having a defect.

\* \* \* \* \*

UNITED STATES PATENT AND TRADEMARK OFFICE
CERTIFICATE OF CORRECTION

PATENT NO. : 6,563,732 B2
DATED : May 13, 2003
INVENTOR(S) : Stella Matarrese et al.

It is certified that error appears in the above-identified patent and that said Letters Patent is hereby corrected as shown below:

<u>Column 2,</u>
Lines 12-13, replace "hereinafter. referred" with -- hereinafter referred --

<u>Column 4,</u>
Line 22, replace "plurality of regular. (i.e.," with -- plurality of regular (i.e., --

<u>Column 9,</u>
Line 57, replace "thereto," with -- thereto; --

<u>Column 13,</u>
Line 13, replace "The nonvolatile memory" with -- The flash memory --
Line 16, replace "The nonvolatile memory" with -- The flash memory --

Signed and Sealed this

Twenty-third Day of March, 2004

JON W. DUDAS
*Acting Director of the United States Patent and Trademark Office*